US012245360B2

(12) United States Patent
Mohr et al.

(10) Patent No.: US 12,245,360 B2
(45) Date of Patent: Mar. 4, 2025

(54) POWER ARRANGEMENT AND COOLING SYSTEM FOR ELECTRONIC DEVICES

(71) Applicant: NVIDIA Corporation, Santa Clara, CA (US)

(72) Inventors: David Mohr, Houston, TX (US); Tahir Cader, Spokane Valley, WA (US); Elad Mentovich, Tel Aviv (IL); Boaz Atias, Ma'ale Adumim (IL); Chong Tan, The Woodlands, TX (US)

(73) Assignee: NVIDIA Corporation, Santa Clara, CA (US)

( * ) Notice: Subject to any disclaimer, the term of this patent is extended or adjusted under 35 U.S.C. 154(b) by 235 days.

(21) Appl. No.: 17/879,620

(22) Filed: Aug. 2, 2022

(65) Prior Publication Data
US 2024/0049380 A1 Feb. 8, 2024

(51) Int. Cl.
*H05K 1/02* (2006.01)
*H05K 7/20* (2006.01)

(52) U.S. Cl.
CPC ....... *H05K 1/0209* (2013.01); *H05K 7/20154* (2013.01); *H05K 7/209* (2013.01); *H05K 7/20909* (2013.01)

(58) Field of Classification Search
CPC .. H05K 1/0201; H05K 1/0203; H05K 1/0204; H05K 1/0209
See application file for complete search history.

(56) References Cited

U.S. PATENT DOCUMENTS 10,701,828 B1 * 6/2020 Vinciarelli ............. H05K 5/065
2009/0296361 A1 * 12/2009 Huang ................... H05K 3/284
361/783

* cited by examiner

*Primary Examiner* — Jeremy C Norris
(74) *Attorney, Agent, or Firm* — Sheridan Ross P.C.

(57) ABSTRACT

A power arrangement and cooling system for electronic devices includes a processing unit electrically interconnected and disposed to a first side of a printed circuit board and a power converter electrically interconnected and disposed on a second side of the printed circuit board. The power converter includes a thermally conductive material layer that transfers heat generated by the power converter during operation away from the power converter toward a heatsink that is disposed adjacent the second side of the printed circuit board. Heat generated by the processing unit is absorbed by a heatsink disposed adjacent the first side of the printed circuit board. Power for the processing unit is provided, by the power converter, through a thickness of the printed circuit board.

20 Claims, 4 Drawing Sheets

POWER ARRANGEMENT AND COOLING SYSTEM FOR ELECTRONIC DEVICES

BACKGROUND

The present disclosure is generally directed to circuit board thermal management, in particular, toward a power component arrangement and cooling system for electronic components associated with printed circuit boards.

During operation, electronic devices, such as microprocessors, graphics processing units, application specific integrated circuits, and the like, are capable of generating significant amounts of heat. In general, this heat is generated by a flow of electric current through one or more resistive elements and/or components in the electronic devices. If the heat is not effectively removed, the temperatures of these electronic devices can exceed engineered upper temperature limits. Exceeding the engineered upper temperature limit of an electronic device can result in decreased device performance, a shorter device life span, failures, and even fires.

BRIEF SUMMARY

Example aspects of the present disclosure include:

A printed circuit board (PCB) assembly, comprising: a PCB comprising a first side and a second side, wherein the first side of the PCB is offset from the second side of the PCB by a thickness of the PCB; at least one processing circuit operatively connected to the PCB adjacent the first side of the PCB, wherein the at least one processing circuit comprises an electronic device that generates heat; a power converter operatively connected to the PCB adjacent the second side of the PCB, wherein the power converter provides power to the at least one processing circuit through the PCB; a first cooling plate arranged adjacent the first side of the PCB, wherein the first cooling plate is operatively coupled to the at least one processing circuit; and a second cooling plate arranged adjacent the second side of the PCB, wherein the second cooling plate is operatively coupled to the power converter, and wherein the PCB, the at least one processing circuit, and the power converter are sandwiched between the first cooling plate and the second cooling plate.

Any of the aspects herein, wherein the power converter comprises at least one direct current to direct current (DC-DC) PCB, wherein the DC-DC PCB is electrically interconnected to the second side of the PCB, and wherein the DC-DC PCB is disposed adjacent the second side of the PCB.

Any of the aspects herein, further comprising: a thermal conductor operatively connected to at least one of the first cooling plate and the second cooling plate.

Any of the aspects herein, further comprising: a thermally conductive material layer attached to the DC-DC PCB and extending along a plane of the DC-DC PCB, wherein the thermally conductive material layer is operatively connected to the thermal conductor, and wherein the thermally conductive material layer transfers heat generated by the power converter along the plane of the DC-DC PCB to the thermal conductor.

Any of the aspects herein, wherein the DC-DC PCB is physically and electrically interconnected to the PCB via a ball grid array on the second side of the PCB.

Any of the aspects herein, wherein the first cooling plate comprises a non-metallic thermally conductive plate that transfers the heat generated by the at least one processing circuit to an environment that is apart from the at least one processing circuit.

Any of the aspects herein, wherein the first cooling plate comprises a metal plate that transfers the heat generated by the at least one processing circuit to an environment that is apart from the at least one processing circuit.

Any of the aspects herein, wherein the metal plate comprises a coolant path disposed therein, and wherein the metal plate is cooled by a coolant that flows through the coolant path from an inlet to an outlet of the metal plate.

Any of the aspects herein, wherein the thermal conductor extends along a direction that is perpendicular to the first side of the PCB, and wherein the plane of the DC-DC PCB is arranged offset from and parallel to the second side of the PCB.

Any of the aspects herein, wherein the thermal conductor is arranged at an outer periphery of the PCB, and wherein the thermally conductive material layer transfers the heat generated by the power converter along the plane of the DC-DC PCB from a portion of the DC-DC PCB to the thermal conductor arranged at the outer periphery of the PCB.

Any of the aspects herein, wherein the thermally conductive material layer comprises: a first portion comprising a metallized layer formed on a first surface of the DC-DC PCB; and a second portion comprising at least one of a graphene material and a carbon nanotube material that is formed on a surface of a nonconductive substrate, wherein the second portion is in contact with the metallized layer at a first point.

Any of the aspects herein, wherein the nonconductive substrate further comprises: a first planar section that is arranged parallel to the plane of the DC-DC PCB at the first point; and a second planar section in contact with the first planar section and arranged perpendicular to the plane of the DC-DC PCB, wherein the second portion of the thermally conductive material layer extends along the first planar section and the second planar section from the first point to a second point.

Any of the aspects herein, wherein the second portion of the thermally conductive material layer is in contact with the first cooling plate at the second point, and wherein an uninterrupted heat transfer path is defined as extending from the first point to the second point along the second portion of the thermally conductive material layer.

A power and cooling system, comprising: a first cooling plate extending a first area along a first plane; a second cooling plate extending a second area along a second plane, wherein the second cooling plate is arranged parallel to the first cooling plate, wherein a distance between the first cooling plate and the second cooling plate defines an interior component space; and a printed circuit board (PCB) comprising a first side and a second side, wherein the first side of the PCB is offset from the second side of the PCB by a thickness of the PCB; a computing device disposed on the first side of the PCB, wherein the computing device generates heat during operation, and wherein the computing device is arranged in contact with the first cooling plate; and a power converter disposed on the second side of the PCB, wherein the power converter provides power to the computing device, and wherein at least a portion of the power converter is arranged in contact with the second cooling plate.

Any of the aspects herein, further comprising: a thermal conductor disposed at least partially inside the interior component space and interconnected to at least one of the first cooling plate and the second cooling plate.

Any of the aspects herein, wherein the power converter further comprises: a thermally conductive material layer disposed at least partially inside the interior component space, wherein the thermally conductive material layer extends along a dimension of the power converter and contacts the thermal conductor forming a first heat transfer path extending from the power converter to the thermal conductor.

Any of the aspects herein, wherein the thermally conductive material layer comprises: a first portion comprising a metallized layer formed on a first surface of the power converter; and a second portion comprising at least one of a graphene material and a carbon nanotube material that is formed on a surface of a nonconductive substrate arranged parallel to the first surface of the power converter, wherein the second portion is in contact with the metallized layer.

Any of the aspects herein, wherein the thermal conductor is interconnected to the first cooling plate and the second cooling plate, and wherein the thermal conductor provides a second heat transfer path between the first cooling plate and the second cooling plate.

A server, comprising: a power supply; a printed circuit board (PCB) comprising a first side and a second side, wherein the first side of the PCB is offset from the second side of the PCB by a thickness of the PCB, and wherein the PCB extends across an area, the area comprising an interior space and an outer periphery; a processing unit (XPU) disposed on the first side of the PCB; a power converter electrically interconnected with the power supply and disposed on the second side of the PCB, wherein the power converter provides power to the XPU; a first cooling plate arranged adjacent the first side of the PCB and in contact with a surface of the XPU; and a second cooling plate arranged adjacent the second side of the PCB and in contact with a surface of the power converter, and wherein the PCB, the XPU, and the power converter are sandwiched between the first cooling plate and the second cooling plate.

Any of the aspects herein, further comprising: a thermal conductor operatively connected to at least one of the first cooling plate and the second cooling plate and extending into a space between the first cooling plate and the second cooling plate; and a thermally conductive material layer attached to the power converter and extending along a surface of the power converter, wherein the thermally conductive material layer is conductively attached to the thermal conductor forming a heat transfer path extending from the power converter to the thermal conductor, and wherein the thermally conductive material layer transfers heat generated by the power converter along the heat transfer path to the thermal conductor.

Any one or more of the above aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

Any one or more of the features disclosed herein.

Any one or more of the features as substantially disclosed herein.

Any one or more of the features as substantially disclosed herein in combination with any one or more other features as substantially disclosed herein.

Any one of the aspects/features/embodiments in combination with any one or more other aspects/features/embodiments.

Use of any one or more of the aspects or features as disclosed herein.

It is to be appreciated that any feature described herein can be claimed in combination with any other feature(s) as described herein, regardless of whether the features come from the same described embodiment.

The details of one or more aspects of the disclosure are set forth in the accompanying drawings and the description below. Other features, objects, and advantages of the techniques described in this disclosure will be apparent from the description and drawings, and from the claims.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B, and C together. When each one of A, B, and C in the above expressions refers to an element, such as X, Y, and Z, or a class of elements, such as X1-Xn, Y1-Ym, and Z1-Zo, the phrase is intended to refer to a single element selected from X, Y, and Z, a combination of elements selected from the same class (e.g., X1 and X2) as well as a combination of elements selected from two or more classes (e.g., Y1 and Zo).

The preceding is a simplified summary of the disclosure to provide an understanding of some aspects of the disclosure. This summary is neither an extensive nor exhaustive overview of the disclosure and its various aspects, embodiments, and configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and configurations of the disclosure are possible utilizing, alone or in combination, one or more of the features set forth above or described in detail below.

Numerous additional features and advantages are described herein and will be apparent to those skilled in the art upon consideration of the following Detailed Description and in view of the figures.

BRIEF DESCRIPTION OF THE SEVERAL VIEWS OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples.

Further features and advantages will become apparent from the following, more detailed, description of the various aspects, embodiments, and configurations of the disclosure, as illustrated by the drawings referenced below.

DETAILED DESCRIPTION

Figure 1:
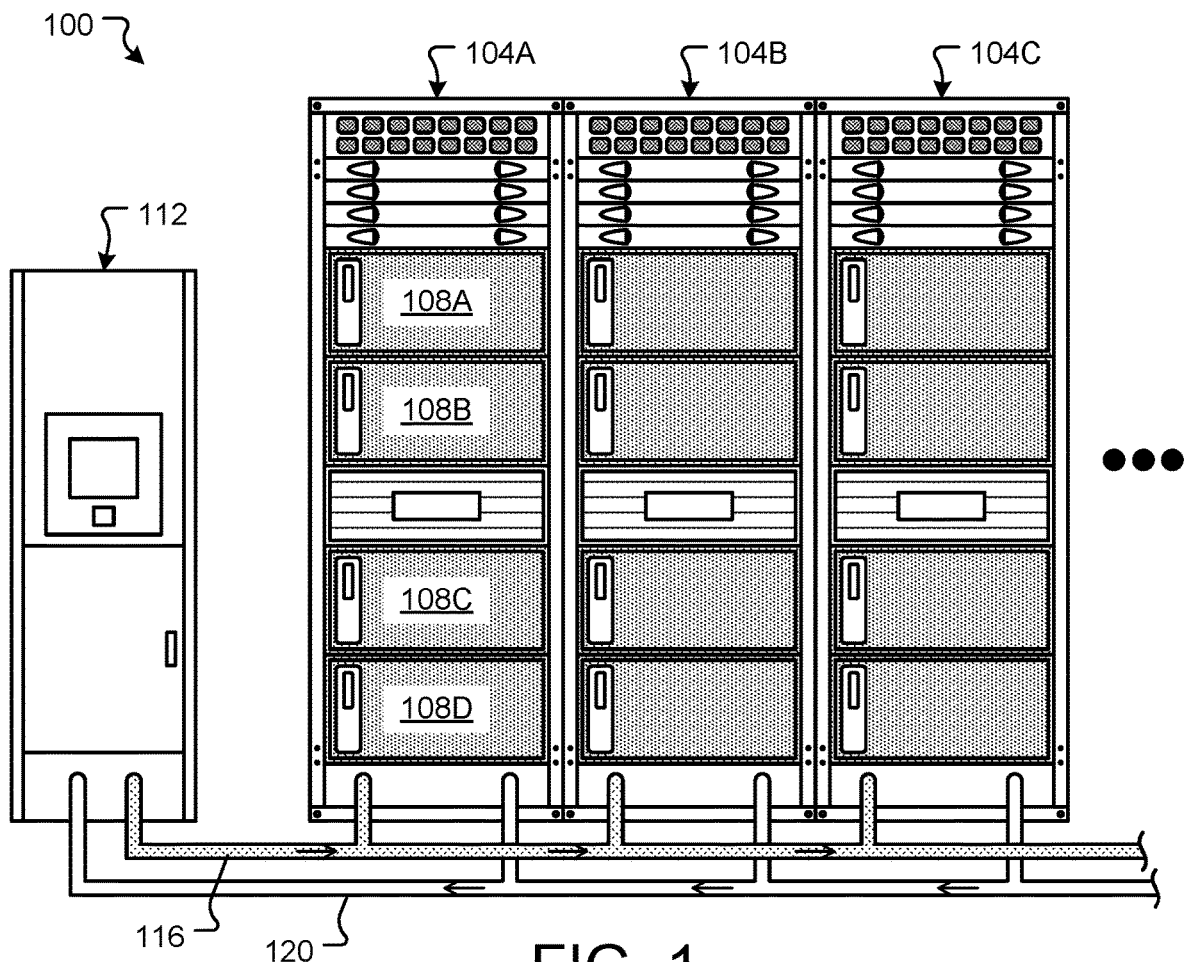
FIG. 1 shows a schematic diagram of a power and cooling system in accordance with embodiments of the present disclosure.

It should be understood that various aspects disclosed herein may be combined in different combinations than the combinations specifically presented in the description and accompanying drawings. It should also be understood that, depending on the example or embodiment, certain acts or events of any of the processes or methods described herein may be performed in a different sequence, and/or may be added, merged, or left out altogether (e.g., all described acts or events may not be necessary to carry out the disclosed techniques according to different embodiments of the present disclosure). In addition, while certain aspects of this disclosure are described as being performed by a single module or unit for purposes of clarity, it should be understood that the techniques of this disclosure may be performed by a combination of units or modules associated with, for example, a computing device.

Before any embodiments of the disclosure are explained in detail, it is to be understood that the disclosure is not limited in its application to the details of construction and the arrangement of components set forth in the following description or illustrated in the drawings. The disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the present disclosure may use examples to illustrate one or more aspects thereof. Unless explicitly stated otherwise, the use or listing of one or more examples (which may be denoted by "for example," "by way of example," "e.g.," "such as," or similar language) is not intended to and does not limit the scope of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

It should be appreciated that the various links connecting the elements can be wired, traces, or wireless links, or any appropriate combination thereof, or any other appropriate known or later developed element(s) that is capable of supplying and/or communicating data to and from the connected elements. Transmission media used as links, for example, can be any appropriate carrier for electrical signals, including coaxial cables, copper wire and fiber optics, electrical traces on a Printed Circuit Board (PCB), or the like.

The terms "determine," "calculate," and "compute," and variations thereof, as used herein, are used interchangeably and include any appropriate type of methodology, process, operation, or technique.

Various aspects of the present disclosure will be described herein with reference to drawings that may be schematic illustrations of idealized configurations.

As the power consumption of graphics processing units (GPUs) increases, cooling becomes an increasing challenge. While some products may offer liquid-cooling, at approximately 700 W per GPU, the liquid-cooling loops are bulky, heavy, rely on large tube sizes with low bend radii (e.g., taking up more space, constraining designs, etc.), and use large and expensive fluid quick disconnects. As the power levels of the GPUs rise, the thermal resistance of the GPUs rises, which forces the $T_j$ (e.g., junction temperature), that has to be maintained, down. At the same time, in an effort to conserve energy and reduce power usage, the industry is anticipating that higher data center facility water temperatures will be supplied to coolant distribution units (CDUs) in the future. Since the CDUs deliver water to the liquid-cooled racks, servers, GPUs, and/or associated GPU equipment, the water flow rates used at a data center may need to be increased, at greater pressures, in order to maintain the required $T_j$. As can be appreciated, this approach can result in an increase in potential leaks, and damage, to the rack equipment motherboards. Moreover, due to the high demand for increased power delivery and high-speed signal requirements, the industry is building more complex, dense, and expensive motherboard PCBs.

It is with respect to the above issues and other problems that the embodiments presented herein were contemplated.

The present disclosure describes advanced power and cooling solutions for PCBs, servers, and associated electronic devices. The advanced power and cooling solution may employ a power arrangement and cooling system that provides a simplified, easier to cool, motherboard PCB. In some examples, the system may include delivering power from underneath the motherboard PCB and not by relying on power delivery through the motherboard PCB via a midplane connection.

The power arrangement and cooling system may utilize thermally conductive material layers attached to one or more components of the motherboard PCB. The thermally conductive material layer may correspond to a graphene and/or a carbon nanotube material. Graphene, for instance, may be used in applications for more efficient power delivery and improved thermal management. Graphene has an extremely high thermal conductivity (e.g., about 1,000 W/m-K) in-plane, but much small thermal conductivity in the cross-plane direction. The graphene thermally conductive material layer may be used to transfer heat from one or more heat-generating components (e.g., GPUs, power converters, processors, portions thereof, solid-state devices, power delivery devices, portions thereof, combinations thereof, and/or the like) associated with the motherboard PCB to a cooling plate.

In some examples, the power arrangement and cooling system may employ a specific power delivery architecture for the electronic devices (e.g., GPUs, etc.) that increases the ability to efficiently and effectively cool the electronic devices and motherboard PCB. For instance, rather than mounting the power converters, such as DC-DC PCBs that provide power to the GPUs, on the same side of the motherboard PCB as the GPU, the power arrangement and cooling system may employ an arrangement where the power converter is attached to the opposite side of the motherboard PCB. This arrangement allows the GPU side of the motherboard PCB to be free of any power converters and can provide simultaneous cooling of the GPU and the power converter utilizing separate cooling plates. In one example graphene may be embedded in the DC-DC PCBs, conducting heat from the DC-DC converters, over to thermal conductors that are interconnected to one or more of the cooling plates. In some examples, the architecture may make use of thermal vias to transport some of the heat from the GPUs into the DC-DC PCBs, so that the heat transported by the thermal vias can be rejected to the thermal (e.g., heat) conductors. Additionally or alternatively, graphene may be embedded in the GPU's PCB for thermal management purposes as well. Among other things, delivering the power from under the GPU simplifies the motherboard PCB design since the bulk of the power delivery is not via a mid-plane and through the motherboard PCB.

Referring now to FIG. 1, a schematic diagram of a power and cooling system 100, of a data center for example, is shown in accordance with embodiments of the present disclosure. In some embodiments, the power and cooling system 100 may include a coolant distribution unit 112 that is capable of supplying coolant via a coolant supply line 116 to one or more server systems 104A-104C. The coolant may be directed to one or more servers 108A-108D associated with each of the server systems 104A-104C. Used coolant (e.g., coolant that is heated from cooling the various components of the servers 108A-108D and/or the server systems 104A-104C, etc.) may be returned to the coolant distribution unit 112 via the coolant return line 120, where the used coolant can be cooled and recirculated to the server systems 104A-104C via the coolant supply line 116. In one embodiment, one or more of the server systems 104A-104C may correspond to a rack of DGX™ A100 brand servers and/or a DGX™ brand SuperPod™ manufactured by NVIDIA®. Additionally or alternatively, one or more of the servers 108A-108D may correspond to DGX™ brand servers, and/or the like, manufactured by NVIDIA®.

As can be appreciated, each of the server systems 104A-104C may include one or more servers 108A-108D, switches, power supplies, memory storage devices, cables, cooling lines, and/or the like. In some embodiments, each of the server systems 104A-104C may include a frame, which may be referred to herein as a rack, that is capable of receiving one or more servers 108A-108D. The rack of the server systems 104A-104C may be configured as cabinet or other enclosure that includes a plurality of rack units (RU) configured to receive equipment associated with the server systems 104A-104C. At least one server 108A-108D may be inserted into the rack of a server system 104A-104C and may take up one or more RU.

The coolant distribution unit 112 may comprise at least one pump, heat exchanger, and processor that is capable of controlling the temperature of a coolant directed by the coolant distribution unit 112. In some embodiments, the coolant described herein may correspond to water or any other liquid that is capable of being cooled by the heat exchanger of the coolant distribution unit 112. In one embodiment, the coolant distribution unit 112 may receive a chilled liquid (e.g., water) and/or may include a chiller that is capable of chilling liquid before the coolant is pumped via the coolant supply line 116 to the server systems 104A-104C.

Figure 2:
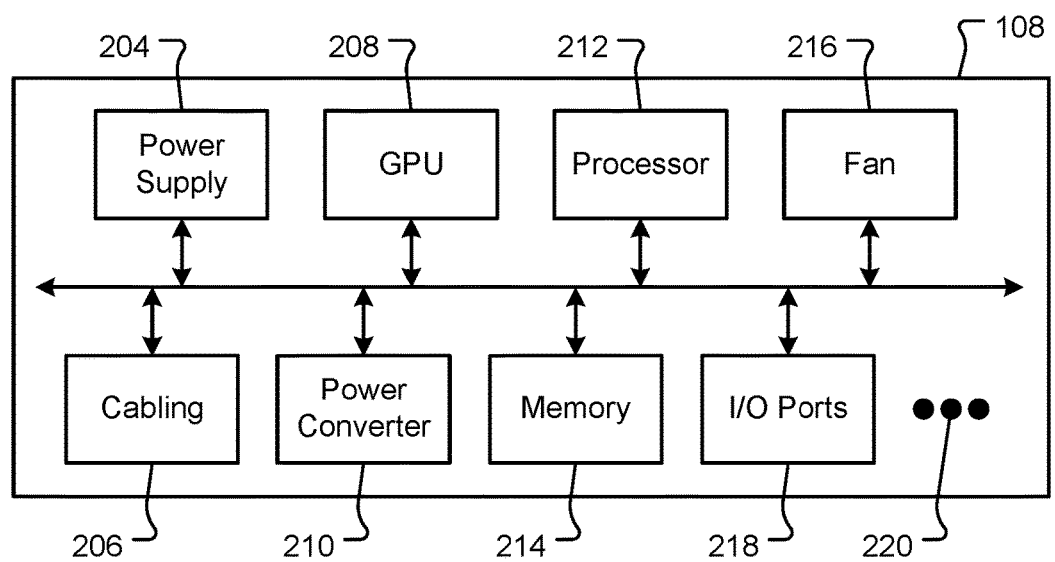
FIG. 2 shows a block diagram of a server in accordance with embodiments of the present disclosure.

FIG. 2 shows a block diagram of a server 108 in accordance with embodiments of the present disclosure. For instance, the server 108 shown in FIG. 2 may correspond to at least one of the servers 108A-108D described above, or vice versa. The server 108 may include a power supply 204, a GPU 208, a power converter 210, a processor 212, a memory 214, a fan 216, I/O ports 218, and/or other components 220. In some embodiments, two or more of the components of the server 108 may be interconnected via cabling 206, an electrical and/or communications bus, electrical traces, electrical interconnections, etc., and/or combinations thereof. These interconnections may be schematically represented by the lines with arrows shown in FIG. 2.

The power supply 204 may provide electrical energy to components of the server 108. In some embodiments, the power supply 204 may include a transformer and/or other electronics that prevent overloading, condition power signals, and/or provide backup power to the server 108.

The GPU 208 may correspond to one or more computer processing devices (e.g., computing device, etc.), processing units, and/or processing circuits. For example, the GPU 208 may be provided as silicon, an Application-Specific Integrated Circuit (ASIC), as a Field Programmable Gate Array (FPGA), any other type of Integrated Circuit (IC) chip, a collection of IC chips, and/or the like. In some examples, the GPU may be provided as a Central Processing Unit (CPU), a graphics processing unit (GPU), a microprocessor, or a plurality of microprocessors. Examples of the GPU 208 may include, but are in no way limited to, the NVIDIA® GeForce® RTX 2000-series processors, NVIDIA® GeForce® RTX 3000-series processors, AMD Radeon™ RX 5000-series processors, AMD Radeon™ RX 6000-series processors, and/or any other graphics processing units.

The power converter 210 may correspond to an electrical circuit or device that is capable of receiving a first voltage (e.g., a first DC voltage, etc.) and generating a different second voltage (e.g., a second DC voltage, etc.). For example a power converter 210 may convert a first voltage of 8 V into a second voltage of 1 V. Additionally or alternatively, the power converter 210 may include multiple components that generate two different voltages from a first received voltage. In this example, the power converter 210 may convert a first voltage of 54 V into a first different voltage of 8 V and a second different voltage of 1 V. In some embodiments, the power converter 210 may include multiple connected power converters. Examples of the arrangement of the power converter 210 of FIG. 2 may be as shown and described in conjunction with FIGS. 3A-3B (e.g., power converter 210, 310).

The processor 212 may be similar, if not identical, to the GPU 208 described above, or vice versa. In some embodiments, the processor 212 may correspond to one or more computer processing devices, processing units, processing circuits, DSPs, general purpose microprocessors (e.g., Intel® Core™ i3, i5, i7, or i9 processors; Intel® Celeron® processors; Intel® Xeon® processors; Intel® Pentium® processors; AMD Ryzen™ processors; AMD Athlon™ processors; AMD Phenom™ processors; Apple A10 or 10X Fusion processors; Apple A11, A12, A12X, A12Z, or A13 Bionic processors; or any other general purpose microprocessors), GPUs (e.g., NVIDIA® GeForce® RTX 2000-series processors, NVIDIA® GeForce® RTX 3000-series processors, AMD Radeon™ RX 5000-series processors, AMD Radeon™ RX 6000-series processors, or any other GPUs), ASICs, FPGAs, or other equivalent integrated or discrete logic circuitry.

The GPU 208 and/or the processor 212 may be generally referred to herein as a "computing device," a "GPU," a "processing circuit," and/or a "processing unit." In some embodiments, the GPU 208 and/or the processor 212 may correspond to a CPU, a GPU, an FPGA, an ASIC, and/or the like. Accordingly, the term "XPU" may be used to refer to the GPU 208 and/or the processor 212 and may include any compute architecture and associated structure that is capable of performing processing functions of at least one server 108. In some embodiments, the XPU may be a multipurpose, programmable device that accepts digital data as input, processes the digital data according to instructions stored in its internal memory, and provides results as output. The XPU may implement sequential digital logic as the XPU may have internal memory. As with most microprocessors, the XPU may operate on numbers and symbols represented in the binary numeral system.

The memory 214, or storage memory, may correspond to any type of non-transitory computer-readable medium. In some example implementations, the memory 214 may comprise volatile or non-volatile memory and a controller for the same. Non-limiting examples of the storage memory 214 that may be utilized in the server 108 may include Random Access Memory ("RAM"), Read Only Memory ("ROM"), buffer memory, flash memory, solid-state memory, or variants thereof. Any of these memory types may be considered non-transitory computer memory devices even though the data stored thereby can be changed one or more times.

The fan 216 may correspond to a device that is capable of moving, or directing, air throughout the server 108 and/or across one or more surfaces of components of the server 108. In some embodiments, the fan 216 may include one or more blades that, when rotated (e.g., via an electric motor, etc.), cause air to move and flow across the components of the server 108. In some examples, the fan 216 may cause air to flow across a heatsink, or cooling plate, of the server 108. The heatsink may be arranged in thermal contact with one or more of the components of the server 108 (e.g., the GPU 208, the processor 212, etc.) that generate heat during operation. As these components generate heat, the heatsink transfers heat away from the components (e.g., by absorbing the heat) and directs at least a portion of the heat to one or more fins or surfaces of the heatsink. The flow of air created by the fan 216 may be caused to pass over the fins or surfaces of the heatsink transferring heat away from the heatsink and into the air. In some embodiments, the air may be caused to exit the server 108. New air may be drawn into the server 108 via operation of the fan 216.

The input/output, or I/O, ports 218 may correspond to one or more interconnections through which the server 108 can receiving information and/or communications. Additionally or alternatively, the I/O ports 218 may correspond to one or more interconnections through which the server 108 can transmit information and/or communications. Examples of the I/O ports 218 may include, but are in no way limited to, an Ethernet port, an RJ-11 port, an RJ-45 port, an RS-232 port, a USB port, etc., and/or combinations thereof.

Figure 3A:
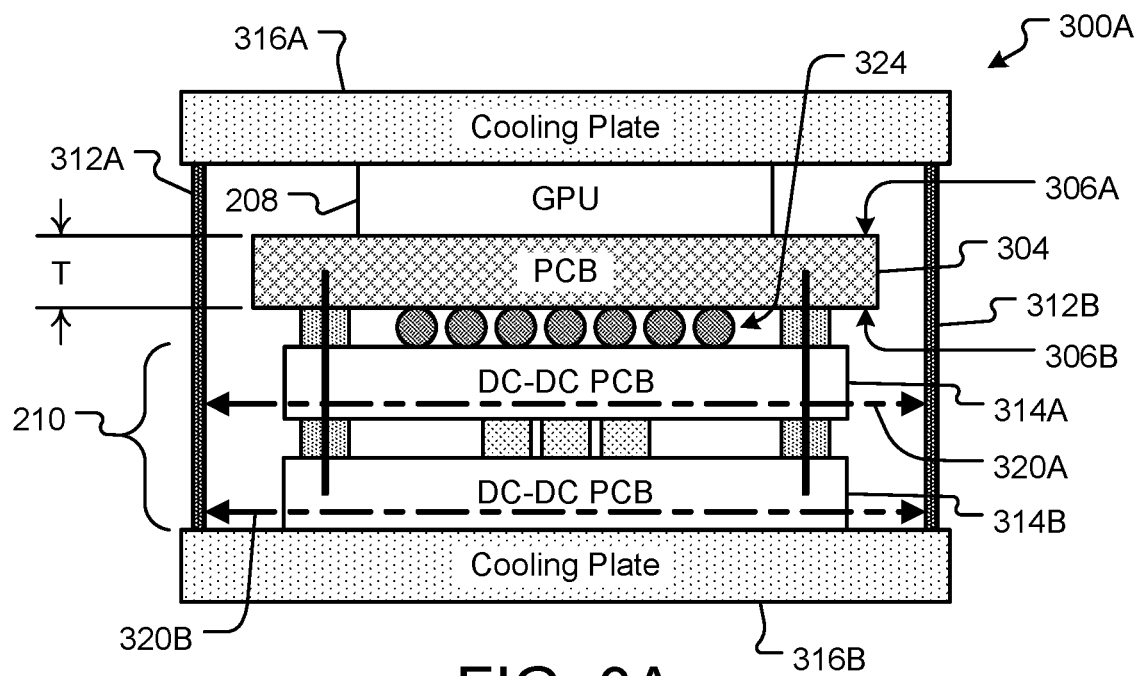
FIG. 3A is a schematic diagram of a printed circuit board assembly and thermal management arrangement in accordance with embodiments of the present disclosure.
Figure 3B:
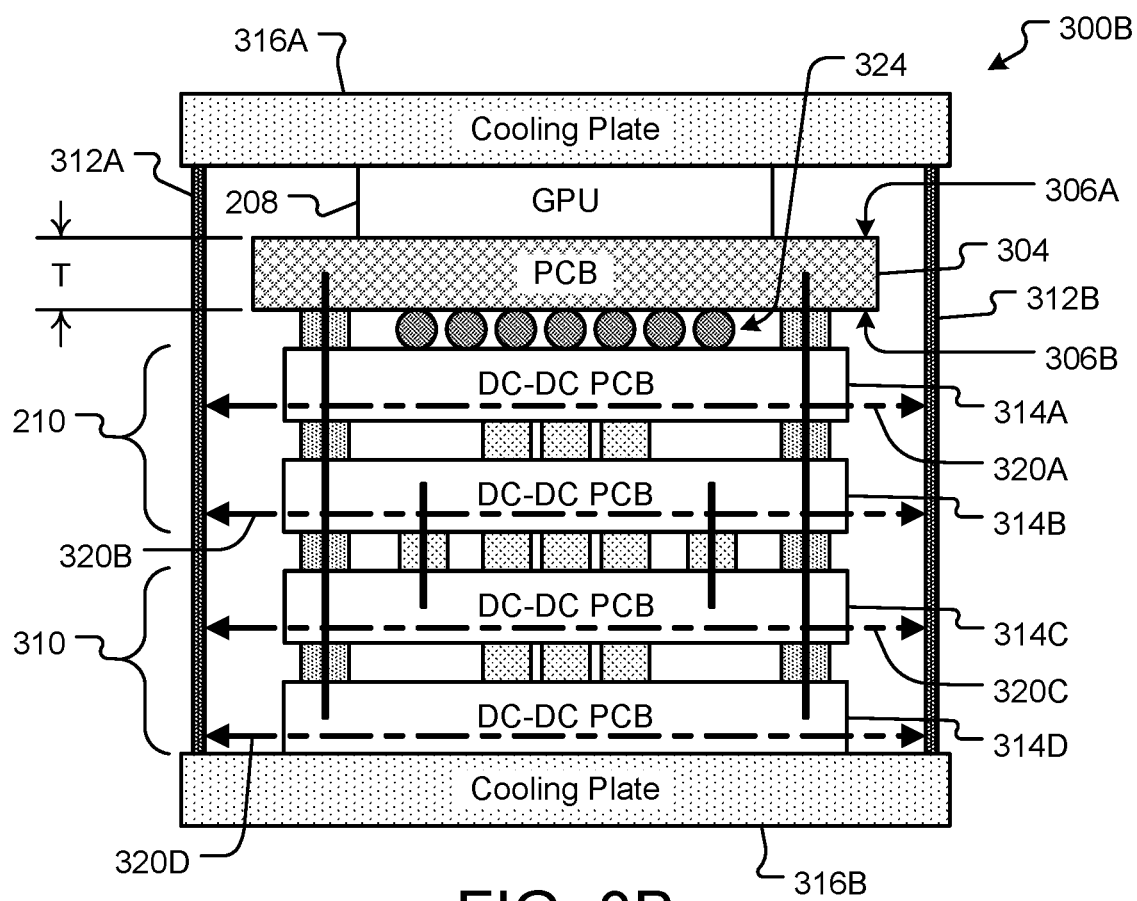
FIG. 3B is a schematic diagram of a printed circuit board assembly and thermal management arrangement in accordance with embodiments of the present disclosure.

FIGS. 3A and 3B show schematic diagrams of a printed circuit board assembly and thermal management arrangement of a server 108 (e.g., the servers 108A-108D described above, etc.) in accordance with embodiments of the present disclosure. In each of the power converter arrangements 300A, 300B shown, the printed circuit board assembly of the server 108 may include a PCB 304. The PCB 304 may be referred to herein as a "motherboard PCB." The PCB 304 may include at least one board substrate (e.g., an electrically insulative layer, etc.) and at least one electrically conductive trace (e.g., copper traces, etc.) formed thereon. In some embodiments, the PCB 304 may be formed including alternating insulative (e.g., electrically insulative) and metallized (e.g., electrically conductive) layers. Examples of the material of the electrically insulative board substrate may include, but are in no way limited to, fiberglass, glass epoxy laminate, polyimide, polyester, polyethylene terephthalate, polyethylene naphthalate, etc., and/or combinations thereof. One example of a glass-reinforced epoxy laminate material for the electrically insulative board substrate is the National Electrical Manufacturers Association (NEMA) grade FR-4 flame retardant composite material. The metallized layer material may correspond to copper, gold, graphene, etc., and/or combinations thereof. The PCB 304 may include a first side 306A offset from a second side 306B by a thickness, T, of the PCB 304.

In some embodiments, a GPU 208 or other XPU may be mounted to the first side 306A of the PCB 304, and a power converter 210 may be mounted to an opposite second side 306B of the PCB 304. The power converter 210 may include at least one DC-DC PCB 314A-314D. By way of example, the power converter 210 includes a first DC-DC PCB 314A and a second DC-DC PCB 314B. The first DC-DC PCB 314A and the second DC-DC PCB 314B may be connected to one another via one or more connections (e.g., shown schematically as a horizontal array of three shaded inner rectangles disposed between the first DC-DC PCB 314A and the second DC-DC PCB 314B in FIGS. 3A-3B). The power converter 210 may be electrically and/or physically connected to the PCB 304 via at least one electrical interconnection 324. In some embodiments, the electrical interconnection 324 may correspond to a ball grid array (BGA) interconnection between the power converter 210 and the PCB 304.

As illustrated in FIGS. 3A-3B, the GPU 208 is operatively connected to the PCB 304 adjacent the first side 306A of the PCB 304 and the power converter 210 is operatively connected to the PCB 304 adjacent the second side 306B of the PCB 304. In this manner, the GPU 208 and the power converter 210 are arranged, respectively, on opposite sides of the thickness, T, of the PCB 304. Stated another way, the first side 306A may not include, or be free of, a power converter 210. In some embodiments, the arrangements of the components shown in FIGS. 3A-3B allow power to be delivered through the PCB 304 (e.g., under the GPU 208). As can be appreciated, this power delivery may be more efficient than conventional designs since the bulk of the power delivery is not via a mid-plane and through the motherboard PCB (e.g., the PCB 304). Moreover, arranging the power converter 210 beneath the PCB 304 and the GPU 208 simplifies the design of the PCB 304 and provides underside power delivery.

In some embodiments, the power converter 210, 310 may include a thermally conductive material layer 320A-320D that is attached to a respective DC-DC PCB 314A-314D. The thermally conductive material layers 320A-320D may be formed on a surface of the DC-DC PCBs 314A-314D, formed in a portion of the PCB 304 (e.g., between layers, beneath a layer, above a layer, etc.), deposited on a surface and/or layer of the PCB 304 (e.g., vapor deposited, printed, etc.), etc., and/or combinations thereof. In some embodiments, the thermally conductive material layers 320A-320D may be embedded within the PCB 304 as a portion of a layer making up the PCB 304. In one embodiment, the thermally conductive material layers 320A-320D may correspond to a layer embedded in a laminate of the PCB 304. In any event, the thermally conductive material layers 320A-320D may extend along a plane of a respective power converter 210, 310 and may be configured to transfer heat (e.g., generated by the respective power converter 210, 310) to one or more heatsinks or cooling plates 316A, 316B. In some embodiments, the heat transferred along the thermally conductive material layers 320A-320D may be conveyed to the one or more cooling plates 316A, 316B via one or more thermal conductors 312A-312B. While the thermally conductive material layers 320A-320D are shown extending horizontally (e.g., along planes that are arranged offset from and parallel to the second side 306B of the PCB 304) in FIGS. 3A-3B, the thermal conductors 312A-312B are shown extending vertically (e.g., along planes that are arranged perpendicular to the first side 306A and/or the second side 306B of the PCB 304) in FIGS. 3A-3B. In some embodiments, the thermally conductive material layers 320A-320D and the thermal conductors 312A-312B may be formed from a continuous thermally conductive material.

The printed circuit board assembly and thermal management arrangements shown in FIGS. 3A-3B may include a first cooling plate 316A that is arranged adjacent the first side 306A of the PCB 304. For instance, the first cooling plate 316A may operatively coupled to at least one surface of the GPU 208. This operative coupling may include the first cooling plate 316A being arranged in direct contact and/or in thermal contact with the GPU 208, etc. In some embodiments, the thermal management arrangements shown in FIGS. 3A-3B may include a second cooling plate 316B that is arranged adjacent the second side 306B of the PCB 304. Stated another way, the cooling plates 316A, 316B shown in FIGS. 3A-3B may be respectively arranged on opposite sides of the PCB 304. The second cooling plate 316B may be parallel to, and arranged offset a distance from, the first cooling plate 316A. The distance between the first cooling plate 316A and the second cooling plate 316B may define, an interior component space that is configured to receive the GPU 208, the PCB 304, the power converter 210, etc. The second cooling plate 316B may be operatively coupled to the power converter 210, 310. For example, the second cooling plate 316B may be arranged in direct contact and/or in thermal contact with the power converter 210, 310. In some embodiments, the PCB 304, the GPU 208, and the power converter 210, 310 are sandwiched between the first cooling plate 316A and the second cooling plate 316B.

The first cooling plate 316A and/or the second cooling plate 316B are not necessarily always thermally connected via the thermal conductors 312A-312B. In one embodiment, the first cooling plate 316A (e.g., the top cold plate) and the second cooling plate 316B (e.g., the bottom cold plate) may be thermally connected via one or more of the thermal conductors 312A-312B. Alternatively, the first cooling plate 316A and the second cooling plate 316B may reject heat (e.g., that is absorbed from one or more components of the server 108) to a remote source independently of each other.

While FIGS. 3A-3B show the same arrangement of the cooling plates 316A, 316B relative to the GPU 208, the PCB 304, and the power converter 210 of the server 108, the first power converter arrangement 300A differs from second power converter arrangement 300B in the total number of DC-DC PCBs 314A-314D. In FIG. 3A, the power converter 210 includes a first DC-DC PCB 314A connected to a second DC-DC PCB 314B. The first DC-DC PCB 314A includes the first thermally conductive material layer 320A and the second DC-DC PCB 314B includes the second thermally conductive material layer 320B. This arrangement may correspond to an 8 VDC to 1 VDC architecture for the power converter 210. FIG. 3B, on the other hand, includes an additional third DC-DC PCB 314C that is connected to a fourth DC-DC PCB 314D (e.g., power converter 310). This second power converter arrangement 300B may correspond to a 54 VDC to 1 VDC architecture (e.g., including the power converter 210 and the power converter 310 as the power converter for the second power converter arrangement 300B). For example, 54 V may be provided by the outer vertical lines extending from the fourth DC-DC PCB 314D to the PCB 304. Continuing this example, 8 V may be provided by the inner vertical lines extending between the third DC-DC PCB 314C and the second DC-DC PCB 314B. In any of the power converter arrangements 300A, 300B, the first DC-DC PCB 314A may provide 1 V to the PCB 304 via the electrical interconnection 324. Other voltages may be provided depending on the arrangement of the power converter 210, 310.

Figure 3C:
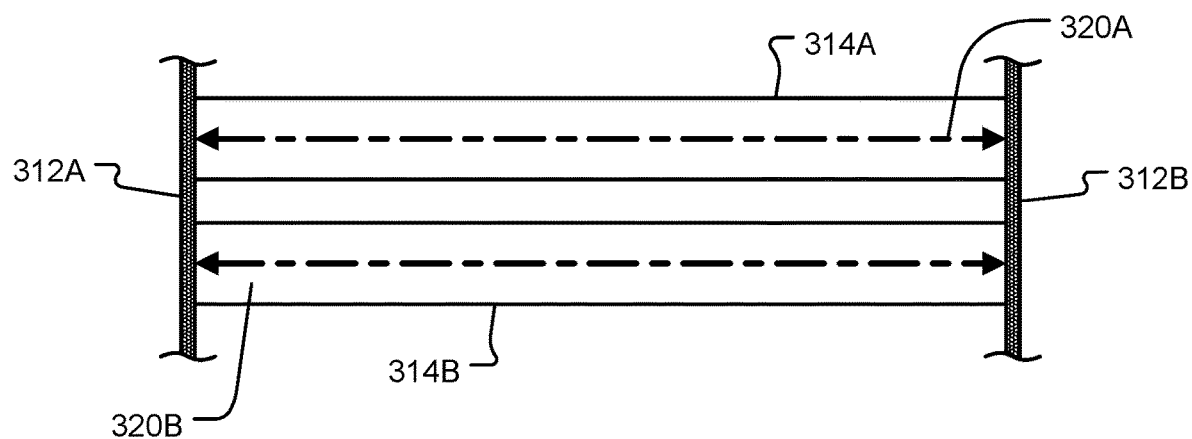
FIG. 3C is a schematic diagram of heat transfer in a thermal management arrangement for a printed circuit board assembly in accordance with embodiments of the present disclosure.

FIG. 3C is a schematic diagram of heat transfer in a thermal management arrangement for a printed circuit board assembly of a server 108 in accordance with embodiments of the present disclosure. As illustrated in FIG. 3C, heat (e.g., generated by the power converter 210, not shown) may be transferred in a direction (e.g., outwardly, away from a center, etc.) from the first DC-DC PCB 314A and/or the second DC-DC PCB 314B to the first thermal conductor 312A and/or the second thermal conductor 312B. The direction of the heat transfer may be indicated by the arrows shown associated with the first thermally conductive material layer 320A and/or the second thermally conductive material layer 320B.

Figure 4:
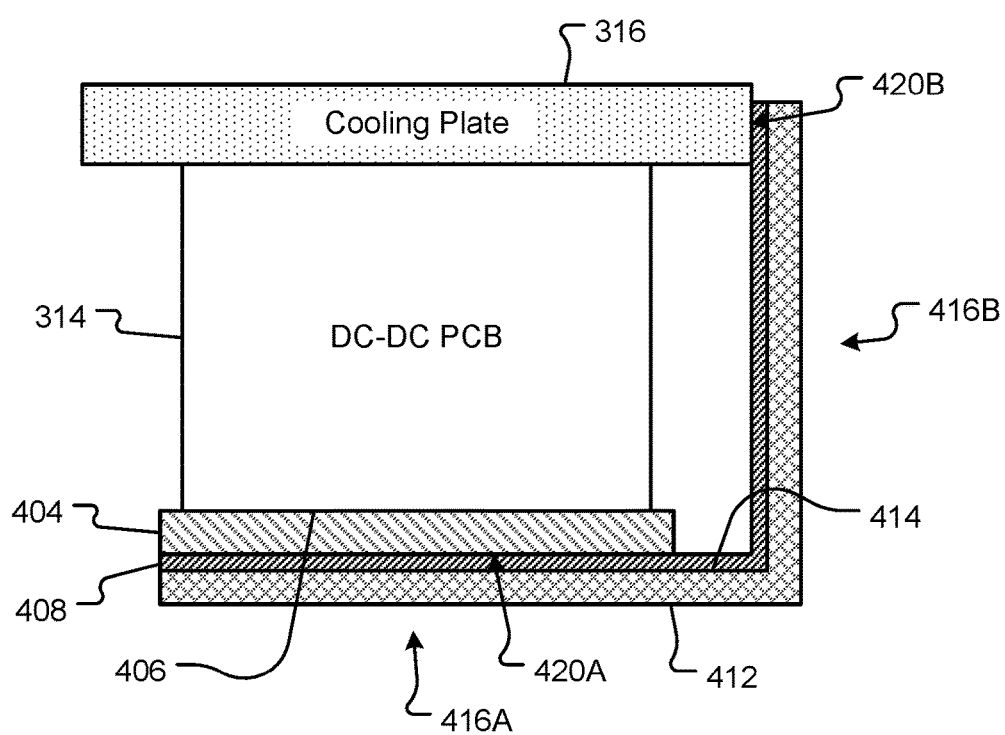
FIG. 4 is a schematic diagram of a thermally conductive material arrangement for managing heat transfer in a printed circuit board assembly in accordance with embodiments of the present disclosure.

FIG. 4 is a schematic diagram of a thermally conductive material arrangement for managing heat transfer in a printed circuit board assembly of a server 108 in accordance with embodiments of the present disclosure. The cooling plate 316 may correspond to the first cooling plate 316A and/or the second cooling plate 316B shown and described in conjunction with FIGS. 3A-3B above. Although shown associated with a DC-DC PCB 314, the arrangement illustrated in FIG. 4 may be the same, or similar, to a portion of the printed circuit board assembly of the server 108 where the DC-DC PCB 314 is replaced with the GPU 208 and the GPU 208 is arranged in contact with the DC-DC PCB 314.

In any case, the DC-DC PCB 314 may correspond to any one or more of the DC-DC PCBs 314A-314D described in conjunction with FIGS. 3A-3C above, or vice versa. In some embodiments, the cooling plate 316 may be arranged in contact with the DC-DC PCB 314. At least one portion of the DC-DC PCB 314 may be thermally connected to the cooling plate 316 via a thermally conductive material layer including a first portion 404 and a second portion 408. In some embodiments, the first portion 404 may correspond to a metallized (e.g., copper, aluminum, nickel, etc.) layer formed on a first surface 406 of the DC-DC PCB 314 (and/or the GPU 208 as described in the arrangement above). In one embodiment, the metallized layer may correspond to a copper material (e.g., at 1 mm to 2 mm thick) that is arranged in thermal contact with the first surface 406 of the DC-DC PCB 314. The second portion 408 of the thermally conductive material layer may be arranged in contact with the first portion 404 at a first point 420A.

The second portion 408 may be formed on a surface 414 of a nonconductive substrate 412. The second portion 408 may correspond to graphene, carbon nanotubes, and/or the like that is mounted to the nonconductive substrate 412. The nonconductive substrate 412 may include a first planar section 416A (e.g., that is arranged parallel to a plane of the DC-DC PCB 314 at the first point 420A) and a second planar section 416B (e.g., that is arranged perpendicular to the plane of the DC-DC PCB at the first point 420A). In some embodiments, the nonconductive substrate 412 may correspond to a fiberglass, glass epoxy laminate, polyimide, polyester, polyethylene terephthalate, polyethylene naphthalate, etc., and/or composite material. One example of such a composite material may include a NEMA grade FR-4 flame retardant composite material and/or the like. The nonconductive substrate 412, and/or the surface 414, may extend from the first point 420A to the second point 420B. In one embodiment, an uninterrupted heat transfer path is defined as extending from the first point 420A to the second point 420B along the second portion 408 of the thermally conductive material layer, the second portion 408 of the thermally conductive material layer being in contact with the cooling plate 316 at the second point 420B.

Figure 5:
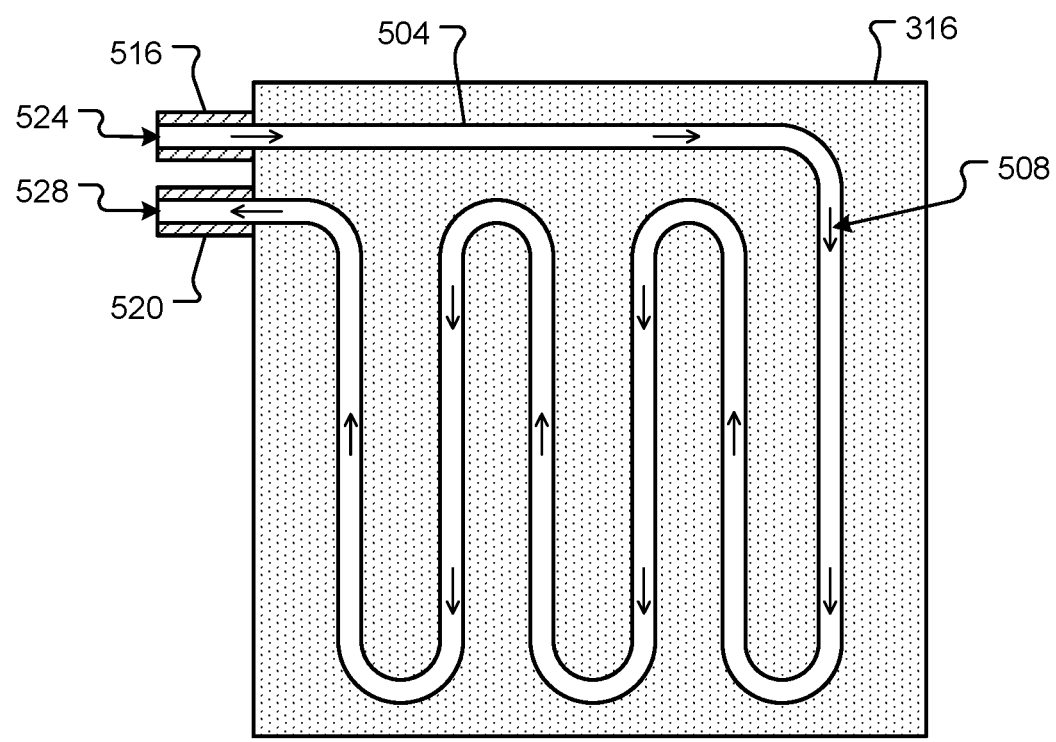
FIG. 5 is a schematic diagram of a coolant path for a cooling plate in accordance with embodiments of the present disclosure.

FIG. 5 is a schematic diagram of a coolant path 504 for a cooling plate 316 in accordance with embodiments of the present disclosure. In some embodiments, the cooling plate 316 may correspond to the first cooling plate 316A and/or the second cooling plate 316B described above. Although shown as including a coolant path 504 in the cooling plate 316 of FIG. 5, the first cooling plate 316A and/or the second cooling plate 316B may correspond to a passive heatsink, a cold plate, or other heat transfer plate without an integral coolant path 504 and/or coolant 508. In some embodiments, the first cooling plate 316A and/or the second cooling plate 316B may correspond to an air-cooled heatsink that dissipates heat as air passes or blows over the heatsink.

The cooling plate 316 may be configured as a metallic or non-metallic plate comprising at least one coolant path 504 disposed therein. The schematic diagram of FIG. 5 may correspond to a cross-sectional view of at least one cooling plate 316A, 316B (e.g., taken along a horizontal line running through a center of the cooling plate 316A, 316B shown in FIGS. 3A-3B). The cooling plate 316 may include a coolant supply line port 516 and a coolant return line port 520 disposed on one or more sides of the cooling plate 316. The coolant supply line port 516 may be configured to connect to the coolant supply line 116 of the coolant distribution unit 112 described in conjunction with FIG. 1. The coolant return line port 520 may be configured to connect to the coolant return line 120 of the coolant distribution unit 112 described in conjunction with FIG. 1. In any event, coolant 508 may enter the cooling plate 316 via the inlet 524 and follow the coolant path 504 in a direction toward the outlet 528. As the coolant 508 passes through the cooling plate 316, at least a portion of the heat (e.g., generated by one or more components of the server 108, etc.) is transferred from the cooling plate 316 to the coolant 508 flowing along the coolant path 504 and is caused to exit the cooling plate 316 via outlet 528. The coolant 508 exiting the outlet 528 of the cooling plate 316 may then be conveyed along the coolant return line 120 to the coolant distribution unit 112 (e.g., where the coolant 508 may be cooled for further circulation, etc.).

In some embodiments, the cooling plate 316 may be made from a metal plate such as aluminum, copper, stainless steel, and/or combinations thereof. Additionally or alternatively, the cooling plate 316 may be made from a thermally conductive plastic, or some other non-metallic conductor. In any event, the cooling plate 316 absorbs heat from the one or more components of the server 108 (e.g., GPU 208, power converter 210, 310, etc.), as described above.

The exemplary systems and methods of this disclosure have been described in relation to GPUs, XPUs, PCBs, datacenters, servers, and server systems. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others.

References in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in conjunction with one embodiment, it is submitted that the description of such feature, structure, or characteristic may apply to any other embodiment unless so stated and/or except as will be readily apparent to one skilled in the art from the description. The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

As used herein, the singular forms "a," "an," and "the" are intended to include the plural forms as well, unless the context clearly indicates otherwise. It will be further understood that the terms "include," "including," "includes," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

It should be understood that every maximum numerical limitation given throughout this disclosure is deemed to include each and every lower numerical limitation as an alternative, as if such lower numerical limitations were expressly written herein. Every minimum numerical limitation given throughout this disclosure is deemed to include each and every higher numerical limitation as an alternative, as if such higher numerical limitations were expressly written herein. Every numerical range given throughout this disclosure is deemed to include each and every narrower numerical range that falls within such broader numerical range, as if such narrower numerical ranges were all expressly written herein.

What is claimed is:

1. A printed circuit board (PCB) assembly, comprising:
   a PCB comprising a first side and a second side, wherein the first side of the PCB is offset from the second side of the PCB by a thickness of the PCB;
   at least one processing circuit operatively connected to the PCB adjacent the first side of the PCB, wherein the at least one processing circuit comprises an electronic device that generates heat, and wherein the first side of the PCB is free of any power converter;
   a power converter operatively connected to the PCB adjacent the second side of the PCB, wherein the power converter provides power to the at least one processing circuit through the PCB;
   a first cooling plate arranged adjacent the first side of the PCB, wherein the first cooling plate is operatively coupled to the at least one processing circuit; and
   a second cooling plate arranged adjacent the second side of the PCB, wherein the second cooling plate is operatively coupled to the power converter, and wherein the PCB, the at least one processing circuit, and the power converter are sandwiched between the first cooling plate and the second cooling plate.

2. The PCB assembly of claim 1, wherein the power converter comprises at least one direct current to direct current (DC-DC) PCB, wherein the DC-DC PCB is electrically interconnected to the second side of the PCB, and wherein the DC-DC PCB is disposed adjacent the second side of the PCB.

3. The PCB assembly of claim 2, further comprising:
   a thermal conductor operatively connected to at least one of the first cooling plate and the second cooling plate.

4. The PCB assembly of claim 3, further comprising:
   a thermally conductive material layer attached to the DC-DC PCB and extending along a plane of the DC-DC PCB, wherein the thermally conductive material layer is operatively connected to the thermal conductor, and wherein the thermally conductive material layer transfers heat generated by the power converter along the plane of the DC-DC PCB to the thermal conductor.

5. The PCB assembly of claim 4, wherein the DC-DC PCB is physically and electrically interconnected to the PCB via a ball grid array on the second side of the PCB.

6. The PCB assembly of claim 5, wherein the first cooling plate comprises a metal plate that transfers the heat generated by the at least one processing circuit to an environment that is apart from the at least one processing circuit.

7. The PCB assembly of claim 6, wherein the metal plate comprises a coolant path disposed therein, and wherein the metal plate is cooled by a coolant that flows through the coolant path from an inlet to an outlet of the metal plate.

8. The PCB assembly of claim 6, wherein the thermal conductor extends along a direction that is perpendicular to the first side of the PCB, and wherein the plane of the DC-DC PCB is arranged offset from and parallel to the second side of the PCB.

9. The PCB assembly of claim 8, wherein the thermal conductor is arranged at an outer periphery of the PCB, and wherein the thermally conductive material layer transfers the heat generated by the power converter along the plane of the DC-DC PCB from a portion of the DC-DC PCB to the thermal conductor arranged at the outer periphery of the PCB.

10. The PCB assembly of claim 9, wherein the thermally conductive material layer comprises:
    a first portion comprising a metallized layer formed on a first surface of the DC-DC PCB; and
    a second portion comprising at least one of a graphene material and a carbon nanotube material that is formed on a surface of a nonconductive substrate, wherein the second portion is in contact with the metallized layer at a first point.

11. The PCB assembly of claim 10, wherein the nonconductive substrate further comprises:
    a first planar section that is arranged parallel to the plane of the DC-DC PCB at the first point; and
    a second planar section in contact with the first planar section and arranged perpendicular to the plane of the DC-DC PCB, wherein the second portion of the thermally conductive material layer extends along the first planar section and the second planar section from the first point to a second point.

12. The PCB assembly of claim 11, wherein the second portion of the thermally conductive material layer is in contact with the first cooling plate at the second point, and wherein an uninterrupted heat transfer path is defined as extending from the first point to the second point along the second portion of the thermally conductive material layer.

13. A printed circuit board (PCB) assembly, comprising:
a PCB comprising a first side and a second side, wherein the first side of the PCB is offset from the second side of the PCB by a thickness of the PCB;
at least one processing circuit operatively connected to the PCB adjacent the first side of the PCB, wherein the at least one processing circuit comprises an electronic device that generates heat;
a power converter operatively connected to the PCB adjacent the second side of the PCB, wherein the power converter provides power to the at least one processing circuit through the PCB;
a first cooling plate arranged adjacent the first side of the PCB, wherein the first cooling plate is operatively coupled to the at least one processing circuit, wherein the first cooling plate comprises a non-metallic thermally conductive plate that transfers the heat generated by the at least one processing circuit to an environment that is apart from the at least one processing circuit; and
a second cooling plate arranged adjacent the second side of the PCB, wherein the second cooling plate is operatively coupled to the power converter, and wherein the PCB, the at least one processing circuit, and the power converter are sandwiched between the first cooling plate and the second cooling plate.

14. A power and cooling system, comprising:
a first cooling plate extending a first area along a first plane;
a second cooling plate extending a second area along a second plane, wherein the second cooling plate is arranged parallel to the first cooling plate, wherein a distance between the first cooling plate and the second cooling plate defines an interior component space;
a printed circuit board (PCB) comprising a first side and a second side, wherein the first side of the PCB is offset from the second side of the PCB by a thickness of the PCB;
a computing device disposed on the first side of the PCB, wherein the computing device generates heat during operation, and wherein the computing device is arranged in contact with the first cooling plate, and wherein the first side of the PCB is free of any power converter; and
a power converter disposed on the second side of the PCB, wherein the power converter provides power to the computing device, and wherein at least a portion of the power converter is arranged in contact with the second cooling plate.

15. The power and cooling system of claim 14, further comprising:
a thermal conductor disposed at least partially inside the interior component space and interconnected to at least one of the first cooling plate and the second cooling plate.

16. The power and cooling system of claim 15, wherein the power converter further comprises:
a thermally conductive material layer disposed at least partially inside the interior component space, wherein the thermally conductive material layer extends along a dimension of the power converter and contacts the thermal conductor forming a first heat transfer path extending from the power converter to the thermal conductor.

17. The power and cooling system of claim 16, wherein the thermally conductive material layer comprises:
a first portion comprising a metallized layer formed on a first surface of the power converter; and
a second portion comprising at least one of a graphene material and a carbon nanotube material that is formed on a surface of a nonconductive substrate arranged parallel to the first surface of the power converter, wherein the second portion is in contact with the metallized layer.

18. The power and cooling system of claim 16, wherein the thermal conductor is interconnected to the first cooling plate and the second cooling plate, and wherein the thermal conductor provides a second heat transfer path between the first cooling plate and the second cooling plate.

19. A server, comprising:
a power supply;
a printed circuit board (PCB) comprising a first side and a second side, wherein the first side of the PCB is offset from the second side of the PCB by a thickness of the PCB, and wherein the PCB extends across an area, the area comprising an interior space and an outer periphery;
a processing unit (XPU) disposed on the first side of the PCB;
a power converter electrically interconnected with the power supply and disposed on the second side of the PCB, wherein the power converter provides power to the XPU, and wherein the first side of the PCB is free of the power converter and any other power converter;
a first cooling plate arranged adjacent the first side of the PCB and in contact with a surface of the XPU; and
a second cooling plate arranged adjacent the second side of the PCB and in contact with a surface of the power converter, and wherein the PCB, the XPU, and the power converter are sandwiched between the first cooling plate and the second cooling plate.

20. The server of claim 19, further comprising:
a thermal conductor operatively connected to at least one of the first cooling plate and the second cooling plate and extending into a space between the first cooling plate and the second cooling plate; and
a thermally conductive material layer attached to the power converter and extending along a surface of the power converter, wherein the thermally conductive material layer is conductively attached to the thermal conductor forming a heat transfer path extending from the power converter to the thermal conductor, and wherein the thermally conductive material layer transfers heat generated by the power converter along the heat transfer path to the thermal conductor.

* * * * *